United States Patent [19]

Davis et al.

[11] 4,390,850

[45] Jun. 28, 1983

[54] OPERATIONAL AMPLIFIER HAVING IMPROVED SLEW RATE/BANDWIDTH CHARACTERISTICS

[75] Inventors: William F. Davis, Tempe; Stuart B. Shacter, Mesa, both of Ariz.

[73] Assignee: Motorola, Inc., Schaumburg, Ill.

[21] Appl. No.: 244,445

[22] Filed: Mar. 16, 1981

[51] Int. Cl.³ .............................................. H03F 3/45
[52] U.S. Cl. .................................. 330/253; 330/257; 330/300; 330/311
[58] Field of Search ................ 330/253, 257, 300, 311

[56] References Cited

PUBLICATIONS

Brokaw et al, "A Fast, High-Precision, Laser--Trimmed FET Input Operational Amplifier," *1974 IEEE International Solid-State Circuits Conference*, Feb. 14, 1974, pp. 142, 143, 244.

*Primary Examiner*—James B. Mullins
*Attorney, Agent, or Firm*—Vincent B. Ingrassia

[57] ABSTRACT

An operational amplifier includes in its first stage current splitting means which enables the slew rate to be varied independently of bandwidth. A pair of dual collector transistors are coupled between the amplifier's input devices and a current mirror circuit. Only one collector of each of the split collector devices is coupled to the current mirror circuit and the current flowing therethrough is controlled by varying the area of the second collector. Slew rate and bandwidth are then controlled by proper selection of current and the ratio of the collector areas.

8 Claims, 1 Drawing Figure

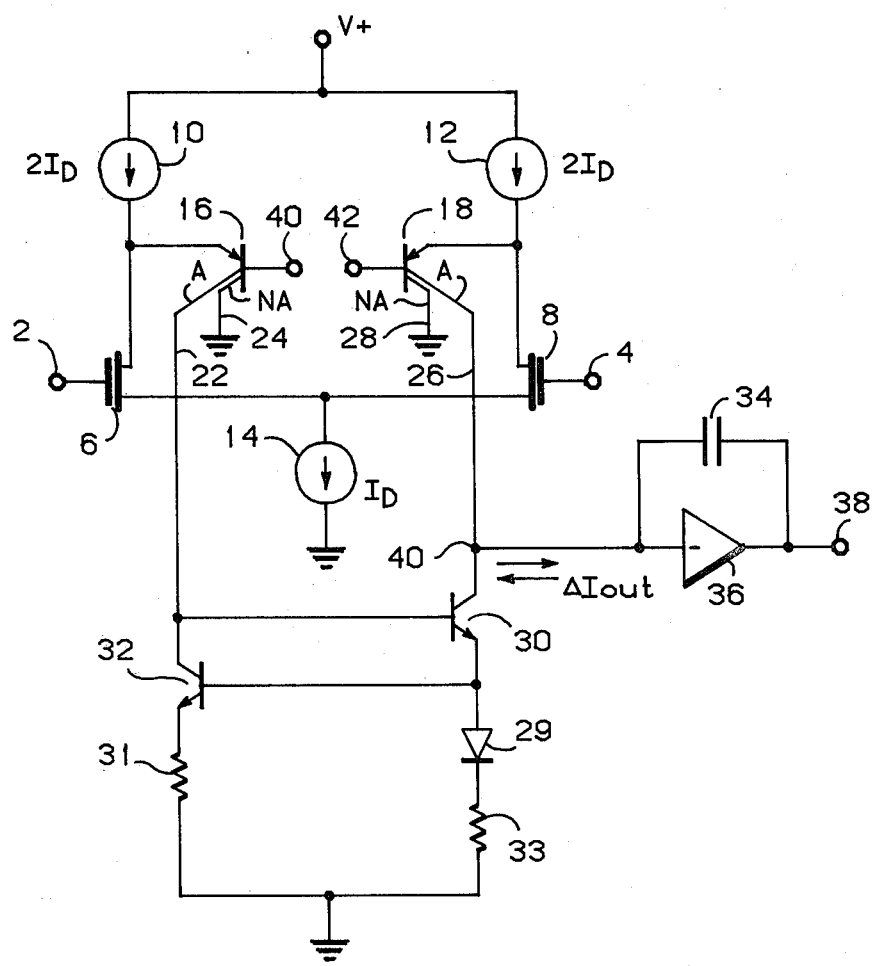

OPERATIONAL AMPLIFIER HAVING IMPROVED SLEW RATE/BANDWIDTH CHARACTERISTICS

BACKGROUND OF THE INVENTION

1. Field of the Invention

This invention relates generally to operational amplifiers and, more particularly, to an operational amplifier having an improved slew rate/bandwidth characteristics.

2. Description of the Prior Art

One prior art operational amplifier utilizes inputs junction field effect transistors (JFETs) which directly drive a current mirror circuit. In such circuits, the bandwidth (BW) is related to the transconductance ($g_m$) as follows:

$$BW = g_m/C$$

where C is the Miller capacitance across the second stage of the amplifier.

The transconductance $g_m$ of a junction field effect transistor (JFET) may be expressed as follows:

$$g_m = (2/V_{po})\sqrt{I_D I_{DSS}}$$

where $V_{po}$ is the pinch-off voltage of the JFETs, $I_D$ is the JFET drain current, and $I_{DSS}$ represents the current that would flow through the JFETs with a zero gate-to-source voltage. Thus, $$BW = 2\sqrt{I_D I_{DSS}}/V_{po}C$$

Since $V_{po}$, C and $I_{DSS}$ are substantially constant in a given circuit, only $I_D$ can be varied to vary BW and $g_m$, and both will vary as $\sqrt{I_D}$.

Slew rate, which is a measure of the rate of output change in response to an instantaneous input change is defined as $$(dV_{OUT}/dt) = I_D/C$$

It is apparent that while BW is directly proportional to $\sqrt{I_D}$, slew rate is directly proportional to $I_D$. Therefore, the values of BW and slew rate are fixed with respect to each other. That is, for a specific value of BW, there is a specific slew rate. Varying $I_D$ to cause an increase/decrease in BW will result in an increase/decrease in slew rate and vice versa.

This strict relationship can be varied by varying both $I_D$ and C. For example, if $I_D$ were increased four times and the capacitance C doubled, slew rate would double while bandwidth remains constant. However, capacitance C is large and occupies a large amount of die area. To increase C would require increased die size and a resulting increased cost.

SUMMARY OF THE INVENTION

It is an object of the present invention to provide an improved operational amplifier.

It is a further object of the present invention to provide an operational amplifier wherein slew rate and bandwidth can be varied independently of each other without varying compensation capacitance.

It is a still further object of the present invention or provide an operational amplifier utilizing JFET input devices where for a constant bandwidth, slew rate can be increased as the square root of the JFET drain current.

According to one aspect of the invention there is provided an amplifier having first and second stages, comprising: first and second field-effect-transistor input devices adapted to receive first and second input signals; a first current source coupled to said first input device for supplying current thereto; a second current source coupled to said second input device for supplying current thereto; first and second current splitting means coupled to said first and second input devices respectively and to said first and second current sources respectively for splitting current supplied thereto by said first and second current sources respectively; and current mirror means coupled between said first and second current splitting means and coupled to said second stage for supplying current to said second stage when said first input device in "on" and said second input device is "off" and for receiving current from said second stage when said second input device is "on" and said first input device is "off".

According to a further aspect of the invention there is provided an operational amplifier for receiving first and second input signals and having an output, said operational amplifier having a bandwidth and a slew rate, comprising: first and second fieldj-effect-transistor input devices adapted to receive first and second input signals; first means for supplying current to said first and second input devices; and second means coupled to said first means and to said first and second input devices for enabling said slew rate and said bandwidth to be varied independently of each other.

BRIEF DESCRIPTION OF THE DRAWING

The above and other objects, features and advantages of the present invention will be more clearly understood from the following detailed description taken in conjunction with the accompanying drawing which is a schematic diagram of the inventive operational amplifier.

DESCRIPTION OF THE PREFERRED EMBODIMENT

The sole FIGURE is a schematic diagram of the inventive operational amplifier which includes first and second stages. The first stage comprises first and second input JFETs 6 and 8 having their gates coupled to input terminals 2 and 4 respectively. The source electrodes of devices 6 and 8 are coupled together and to ground via current sink 14. The drain electrodes of devices 6 and 8 are coupled respectively through current sources 10 and 12 to a source of supply voltage V+. Each of current sources 10 and 12 generates a current $2I_D$, and each of devices 6 and 8 are structured so as to conduct current $I_D$ when "on". The drain electrodes of devices 6 and 8 are also coupled respectively to the emitter electrodes of split collector transistors 16 and 18. Transistor 16 has a first collector 22 having an area A and a second collector 24 having an area NA where N is greater 1. Similarly, transistor 18 has a first collector 26 having an area A and a second collector 28 having an area NA. The second collectors of devices 16 and 18 (i.e. collectors 24 and 28 respectively) are coupled to any DC or AC potential; e.g. ground. The first collectors of transistors 16 and 18 (i.e. collectors 22 and 26) are coupled to a Wilson current mirror circuit comprising transistors 30 and 32, diode 29, and resistors 31 and 33. Specifically, collector 22 is coupled to the base electrode of transistor 30 and to the collector of transistor 32. Collector 26 is coupled to the collector of transistor 30. The base of transistor 32 is coupled to the emitter of transistor 30 and to the anode of diode 29. Both the cathode of diode 29 and the emitter of transistor 32 are coupled to ground via resistors 33 and 31 respectively. The first stage output is taken off the collector of transistor 30 (node 40) and is applied to the second stage of the amplifier which comprises amplifier 36 and capacitor 34 coupled thereacross.

The circuit operates as follows. Devices 6 and 8 are N-channel devices and are normally "on" in the balanced state until a positive or negative voltage is applied to one of their gate electrodes with respect to the other. Assuming that device 6 is "on" and device 8 is "off", current $I_D$ flows through device 6. The remainder of current being sourced by current source 10 flows into the emitter of device 16 causing a current to flow in collector 22 which is applied to the current mirror. Since device 8 is "off", all of the current being sourced by current source 12 flows into the emitter of device 18. Thus, the current flowing in collector 26 is greater than the current flowing in collector 22. Since the current mirror attempts to pull current through transistor 30 which is equal to that flowing in collector 22, a net current will flow via node 40 to the second stage of the operational amplifier. If, on the other hand, device 6 were "off" and device 8 "on", all the current being sourced by current source 10 would be applied to device 16 whereas only a portion of the current being sourced by current source 12 would be applied to device 18. Thus, the current flowing in collector 22 would exceed that flowing in collector 26. As a result, the current mirror would attempt to pull more current through transistor 30 than is being supplied by collector 26 and therefore current would flow from output terminal 38 through capacitor 34 and into the collector of transistor 30.

The transconductance $g_{mI}$ of the input circuit shown in the drawing may be expressed as the ratio of a change in the first stage output current $\Delta I_{OUT}$ to an associated change in input voltage. That is, $$g_{mI} \Delta I_{OUT}/\Delta V_{IN}$$

Since devices 16 and 18 are split collector devices, the change in current appearing at the unit area collectors of devices 16 and 18 will be less than that which appears at their emitters by a factor $N+1$. Thus, is should be apparent that the transconductance $g_{mI}$ is altered by a factor $N+1$. In this case, $$BW = 2\sqrt{I_D I_{DSS}}/V_{po}C(N+1)$$

With device 8 "off", the current flowing into node 40 is $2I_D/(N+1)$. The current flowing in transistor 30 is $I_D/(N+1)$. The difference, $I_D/(N+1)$, is the current flowing into the second stage. Therefore, $$\text{slew rate} = I_D/C(N+1)$$

It will now be demonstrated how slew rate can be increased while maintaining bandwidth constant without varying C. If, for example, $I_D$ were increased by a factor of 4, then $$\text{slew rate} = 4I_D/C(N+1)$$

Since bandwidth is directly proportional to the square root of $I_D$ which has been increased by 4, the bandwidth would increase by a factor of 2. This increase in bandwidth may be undesirable since increased open loop excess phase shift may result producing potential closed loop frequency instabilities. To maintain a constant bandwidth, $(N+1)$ may be increased by a factor of 2 since bandwidth is inversely proportional to $N+1$. However, substituting this value of $N+1$ into the denominator of the slew rate equation results in a net doubling of slew rate. It can be seen then that by adjusting $(N+1)$ for a constant bandwidth, slew rate may be increased as a square root of $I_D$.

The above description is given by way of example only. Changes in form and details may be made by one skilled in the art without departing from the scope of the invention. For example, the field effect transistor devices used in the circuit may be N-channel or P-channel. Further, while split collector transistors have been shown, each may be replaced by two single collector transistors, each pair having their emitter electrodes coupled together and all four single collector devices having common bases. In addition, the unused collectors 24 and 28 can be coupled to any AC or DC potential including ground.

We claim:

1. An amplifier having first and second stages, comprising:
    first and second field-effect-transistor input devices adapted to receive first and second input signals;
    a first current source coupled to said first input device for supplying current thereto;
    a second current source coupled to said second input device for supplying current thereto;
    first and second current splitting means coupled to said first and second input devices respectively and to said first and second current sources respectively for splitting current supplied thereto by said first and second current sources respectively; and
    current mirror means coupled between said first and second current splitting means and coupled to said second stage for supplying current to said second stage when said first input device is on and said second input device is off and for receiving current from said second stage when said second input device is on and said first input device is off, said first current splitting means comprising transistor means having an emitter coupled to said first current source, a first collector coupled to said current mirror means, a second collector adapted to be coupled to a first source of voltage and having a base electrode adapted to be coupled to a bias potential, said first and second collectors being of different area.

2. An amplifier according to claim 1 wherein said second current splitting means comprises second transistor means having an emitter coupled to said second current source, a base adapted to be coupled to a bias potential, a first collector coupled to said current mirror means and to said second stage, and a second collector adapted to be coupled to said first source of supply voltage.

3. An amplifier according to claim 2 wherein said first and second transistor means are dual collector transistors.

4. An amplifier according to claim 2 wherein said first and second input devices comprise respectively first and second junction field-effect-transistors having common source electrodes, said first junction field-effect-transistor having a gate electrode adapted to receive said first input signal and a drain electrode coupled to said first current source and to the emitter of said first transistor means, said second junction field-effect-transistor having a gate electrode adapted to receive said second input signal and a drain electrode coupled to said second current source and to the emitter of said second current means.

5. An operational amplifier for receiving first and second input signals and having an output, said operational amplifier having a bandwidth and a slew rate, comprising:
   first and second field-effect-transistor input devices adapted to receive first and second input signals;
   first means for supplying current to said first and second input devices;
   second means coupled to said first means and to said first and second input devices for enabling said slew rate and said bandwidth to be varied independently of each other; and
   current mirror means coupled to said second means and to said output, said second means comprising first and second transistor means each having a first collector coupled to said current mirror means and a second collector adapted to be coupled to a source of voltage for splitting current supplied thereto by said first means.

6. An operational amplifier according to claim 5 wherein each of said first and second transistor means comprise dual collector transistors.

7. An operational amplifier according to claim 6 wherein said first means comprises:
   a first current source adapted to be coupled between a second source of supply voltage and the emitter of said first transistors means; and
   a second current source adapted to be coupled between said second supply voltage and the emitter of said second transistor means.

8. An operational amplifier according to claim 7 wherein said first and second input devices comprise respectively first and second junction field-effect-transistors having common source electrodes, the gate of said first junction field-effect-transistor being adapted to receive said first input signal and the gate of said second junction field effect transistor being adapted to receive said second input signal, the drain of said first junction field-effect-transistor being coupled to said first current source and to the emitter of said first transistor means, and the drain of said second junction field-effect-transistor being coupled to said second current source and to the emitter of said transistor means.

* * * * *